United States Patent [19]

Kosaka et al.

[11] Patent Number: 4,992,393

[45] Date of Patent: Feb. 12, 1991

[54] METHOD FOR PRODUCING SEMICONDUCTOR THIN FILM BY MELT AND RECRYSTALLIZATION PROCESS

[75] Inventors: Daisuke Kosaka, Takarazuka; Junichi Konishi, Ikeda, both of Japan

[73] Assignee: Ricoh Company, Ltd., Tokyo, Japan

[21] Appl. No.: 529,248

[22] Filed: May 25, 1990

[30] Foreign Application Priority Data

Jun. 1, 1989 [JP] Japan .................................. 1-140562
Feb. 21, 1990 [JP] Japan .................................. 2-41469

[51] Int. Cl.$^5$ ........................................... H01L 21/20
[52] U.S. Cl. .................................... 437/83; 437/173; 148/DIG. 90
[58] Field of Search ................... 437/173, 174, 83, 89, 437/90, 103, 109, 967, 973, 62; 156/603; 148/DIG. 1, DIG. 3, DIG. 90, DIG. 122

[56] References Cited

U.S. PATENT DOCUMENTS

| 4,751,193 | 6/1988 | Myrick ................................... 437/84 |
| 4,822,752 | 4/1989 | Sugahara et al. ..................... 437/173 |
| 4,915,772 | 4/1990 | Fehlner et al. ....................... 156/603 |

FOREIGN PATENT DOCUMENTS

| 0127323 | 12/1984 | European Pat. Off. ............. 437/83 |
| 30314 | 2/1987 | Japan .................................... 437/83 |

Primary Examiner—Brian E. Hearn
Assistant Examiner—Linda J. Fleck
Attorney, Agent, or Firm—Cooper & Dunham

[57] ABSTRACT

A method for producing a semiconductor thin film by melt and recrystallization process. At least one recess is formed in a stacked layered structure including a semiconductor thin film layer. The recess has an arrow head shape seen from a surface side of the layered structure. The apex of the arrow head shape is oriented to a forward direction on a scanning line. The surface of the layered structure is covered with a cooling medium so that the recess is filled with the cooling medium. An energy beam is irradiated to the layered structure through the cooling medium to scan the structure along the scanning line so as to melt the semiconductor thin film and after that the semiconductor is cooled and recrystallized to form a single crystal structure therein.

13 Claims, 5 Drawing Sheets

METHOD FOR PRODUCING SEMICONDUCTOR THIN FILM BY MELT AND RECRYSTALLIZATION PROCESS

BACKGROUND OF THE INVENTION

1. Field of the Invention

The present invention relates to a method for forming a single crystal semiconductor thin film which constitutes a so-called SOI (Silicon on Insulator) structure of an electronic circuit formed on a dielectric substrate.

2. Description of the Related Art

Various methods for forming the SOI structure of single crystal semiconductor thin film have been proposed. However, it has been difficult to form the single crystal thin film over a wide area on the substrate. For example, one of the methods is such that an energy beam such as a laser beam is irradiated to a polycrystalline silicon layer formed over an entire surface of a dielectric substrate so as to recrystallize the silicon layer. However, the crystal growth starts from the peripheral portion of the area where the beam is irradiated toward the centrer portion of the area so that a number of cores are formed. Therefore, crystal faces of the cores encounter each other, which impedes the growth of a large single crystal.

Also, in the melt and recrystallization process, the outer surface of the semiconductor thin film is being in contact with the air which has a low thermal conductivity. As a result, the heat radiation effect from the film surface is low compared to that of the rear side of the film opposite to the outer surface, which makes the temperature distribution uneven with respect to the direction of the thickness of the film. This also impedes the growth of a large single crystal.

To cope with this problem, it is proposed to irradiate and scan the thin film with a laser beam in such a way that the film surface is coated with a cooling medium such as polyethylene glycol which enhances the heat radiation from the film surface.

However, even if the thin film is coated with the cooling medium, the temperature distribution of the thin film is different from that of the beam spot of the laser which scans the thin film to melt and recrystallize the film. More precisely, the laser beam spot has a Gaussian temperature distribution. When this laser beam scans the semiconductor thin film surface along a certain direction, the profile of the temperature distribution represented by the contour lines becomes longitudinal so that the tail portion thereof is elongated toward the direction opposite to the scanning direction. As a result, the temperature difference between the beam trace of the spot center and that of the periphery of the spot becomes large, which causes generation of cracks at the time of recrystallization.

SUMMARY OF THE INVENTION

It is therefore an object of the present invention to provide a method for forming a high quality single crystal thin film by such a way that a cooling medium covers a thin film structure including a semiconductor thin film to be melted and recrystallized and that the covered film structure is irradiated by an energy beam such as a laser beam to scan and recrystallize the thin film structure, wherein the temperature distribution is improved so that the contour profile thereof is not elongated in the direction opposite to the scanning direction, that is, backward along the scanning direction.

In accordance with the present invention, at least one arrow head shape recess, that is, a reversed V shaped recess or a triangle recess when seen from the surface side of the thin film structure is formed on the structure. The surface is covered with a cooling medium. An energy beam scans the thin film along the center line of the arrow head shape recess in the direction of the arrow.

In accordance with a preferred embodiment of the present invention, two V shaped or triangle recesses are arranged to form a rhombus shape, wherein the apices of the two triangles are disposed on the scanning line of the energy beam.

The thin film structure comprises a dielectric substrate, a polycrystalline or amorphous semiconductor thin film formed on the substrate, and a protective cap layer made from a dielectric film covering the semiconductor film. The dielectric substrate comprises, for example, a silicon substrate on which a silicon oxide film is formed or a glass substrate on which a silicon oxide film is formed. The protective cap film comprises, for example, a silicon oxide film, a silicon nitride film, or a combination of the silicon oxide film and the silicon nitride film.

An advantage of the present invention is that a high quality single crystal thin film can be formed by the thin film structure arranged in such a way that the surface of the thin film structure including a semiconductor thin film is covered with a cooling medium and that recesses are formed in the region where the single crystal for core of the crystal growth is formed so as to compensate for the uneven temperature distribution affected by the scanning energy beam such as a laser beam.

Further objects and advantages of the present invention will be apparent from the following description of the preferred embodiments of the invention as illustrated in the accompanying drawings.

DESCRIPTION OF THE PREFERRED EMBODIMENTS

The present invention is further described hereinafter by way of examples thereof and the principle of the invention as well with reference to the drawings.

Figure 2:
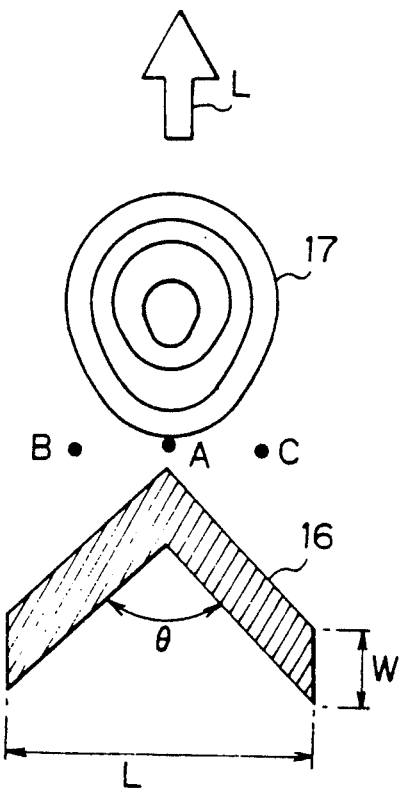
FIG. 2 is an explanatory view for explaining a temperature distribution of the semiconductor thin film of the embodiment of the invention.

An essential principle of the first embodiment of the present invention is illustrated in FIG. 2.

FIG. 2 represents a plan view of a cooling medium such as polyethylene glycol which covers a thin film structure surface having a reversed V-shape, that is, an arrow head shape recess 16 formed therein. The thickness of the cooling medium layer is enlarged in the portion where the recess 16 is formed by the depth of the recess so that the heat radiation effect is enhanced in the recess portion. When an energy spot of a laser beam scans the structure in the direction as shown by an arrow L, the temperature distribution of the structure becomes as illustrated by the contours indicated by the reference numeral 17. The tail portion of the contour profile formed in the direction opposite to the scanning direction L is shortened compared to that of FIG. 7 right after the beam has passed the recess 16. This is because the center portion A is cooled more than the adjacent side portions B and C behind the recess 16 right after the beam has passed the recess. Due to such a temperature distribution, large single crystals grow easily in the structure.

Figure 4:
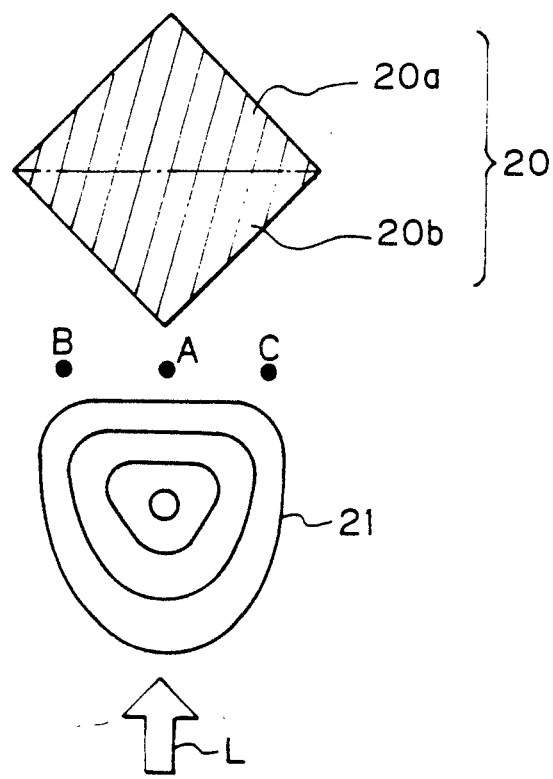
FIG. 4 is an explanatory view of a temperature distribution of the semiconductor thin film of the embodiment of FIG. 3.

An essential principle of the second embodiment of the present invention is illustrated in FIG. 4.

The structure of FIG. 4 comprises a recess 20 formed from two triangle recesses, i.e., a first recess 20a and a second recess 20b combined together to form a rhombus shape in such a way that the apex of the first recess 20a is oriented to the scanning direction L while the apex of the second recess 20b is oriented to the direction opposite to the scanning direction L and that the base sides of the triangles are faced to each other and combined together.

The energy spot passes along the scanning line which passes the two apices of the recesses 20a and 20b in the direction L. When the spot is positioned in front of the recess 20, the temperature distribution of the structure becomes as illustrated by the contours 21 in FIG. 4 due to the second recess 20b which cools the structure so that the center portion A is cooled more than the adjacent side portions B and C. When the energy spot has passed through the recess 20 and it is positioned right behind the recess, the tail portion of the temperature distribution is prevented from being elongated toward the direction opposite to the scanning direction L due to the cooling function of the first recess 20a in the same manner as explained in FIG. 2.

Figure 7:
FIG. 7 is an explanatory view for explaining a temperature distribution of the semiconductor thin film in accordance with the related art.
Figure 7:
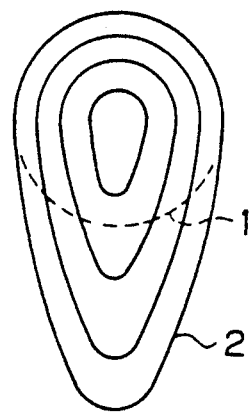

In general, if a thin film structure is coated with a cooling medium, the temperature distribution of the thin film becomes different from that of the beam spot of the laser which scans the thin film to melt and recrystallize the film. More precisely, the laser beam spot has a Gaussian temperature distribution. When the laser beam spot 1 (dash line) having the Gaussian temperature distribution scans the semiconductor thin film surface along the scanning direction L, as illustrated in FIG. 7, the profile of the temperature distribution becomes longitudinal so that the tail portion thereof is elongated toward the direction opposite to the scanning direction L, as represented by contours 2 depicted in solid lines in FIG. 7. As a result, the temperature difference between the beam trace of the center of the spot 1 and that of the periphery of the spot 1 becomes large, which causes generation of cracks at the time of recrystallization.

Such a problem can be obviated by the present invention in accordance with the above mentioned principles of the invention.

FIGS. 1a to 1d represent in sequence a process for producing the semiconductor thin film in accordance with an embodiment of the present invention.

Figure 1A:
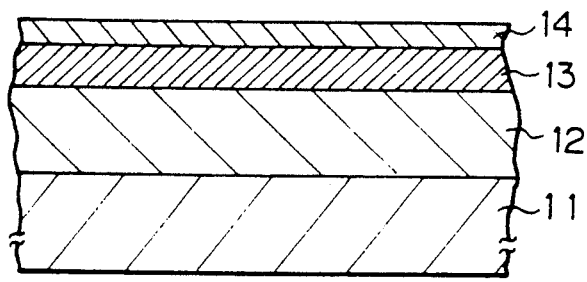
FIGS. 1a to 1d are explanatory views for explaining the process for producing the thin film structure of the present invention representing the thin film structure in different steps of the producing process in this order in accordance with the present invention.

First, as illustrated in FIG. 1a, a silicon substrate 11 is heated and oxidized to form a silicon oxide film 12 of about 8000 Å thick on the substrate 11. Then, a polycrystalline silicon thin film 13 of about 5000 Å thick is formed on the film 12 by a reduced pressure CVD method. After that, a silicon oxide film 14 of about 2000 Å thick is formed on the film 13 by a reduced CVD method.

Figure 1B:
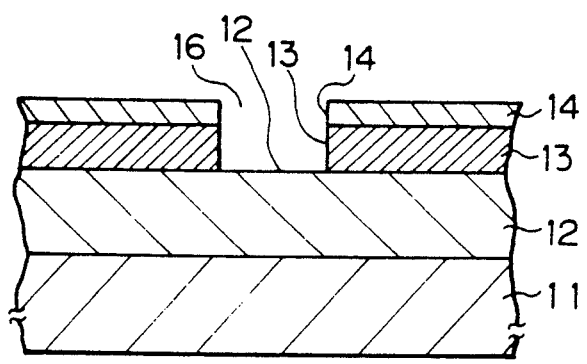

Second, as illustrated in FIG. 1b, a recess 16 is formed through the films 13 and 14 by such a way that a resist pattern having an opening of V shape as illustrated in FIG. 2 is formed on the film 14 and that the films 13 and 14 are etched using the resist as a mask. The sections of the films 13 and 14 are exposed in the recess 16 to form the inner side wall thereof. Also, the upper surface of the film 12 is exposed in the recess 16 to form the bottom surface thereof. The resist is removed after the etching process to form the recess 16.

Figure 1C:
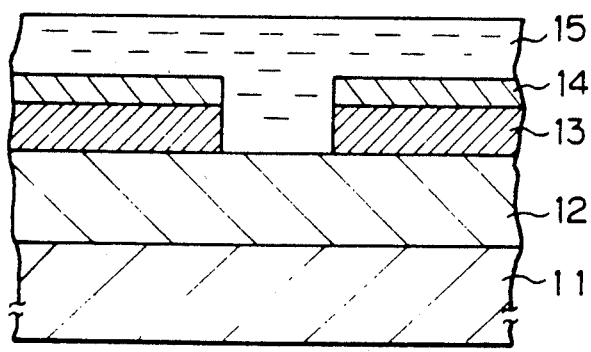

After that, as illustrated in FIG. 1c, a cooling medium layer made from a polyethylene glycol layer 15 of about 1 mm thick is formed all over the structure sample.

Figure 1D:
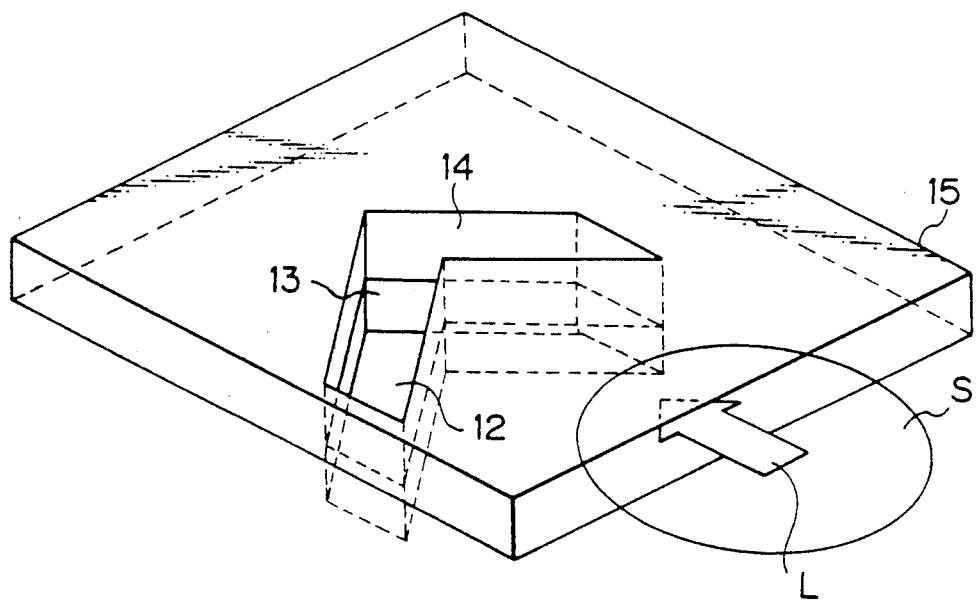

After that, as illustrated in FIG. 1d, the sample is irradiated and scanned by a laser beam through the film 15. The reference S represents the laser beam spot. The beam scans the sample along the scanning line which passes the apex of the recess 16 in the direction L as illustrated in FIG. 1d.

As the scanning laser beam, for example, an argon ion laser converged by a lens may be used. The power of the laser is for example 5 W.

Along the scanning line after the laser beam has passed, a single crystal thin film is formed in such a way that the polycrystalline silicon film 13 is melted and recrystallized. Especially, a high quality single crystal is formed right after the laser beam has passed the recess 16.

The size of the recess 16 is equal to or slightly larger than the laser beam spot S. When the recess 16 is formed on a dicing line, since the width of the line is usually about 100 $\mu$m, the dimensions of the recess 16 of FIG. 2 is determined as such that the lateral length L is about 80 $\mu$m to be contained within the line width, the angle $\theta$ of the V shape is about 90 to 100 degrees and that the width W of the recess is about 30 to 50 $\mu$m.

When only one V shaped recess 16 is formed, since a high quality single crystal grows in the vicinity of the recess 16, the single crystal can be used as a crystal species so that the single crystal grows in a wide area by scanning the sample by the laser beam in the directions intersecting the scanning direction L in FIG. 1d.

Figure 3:
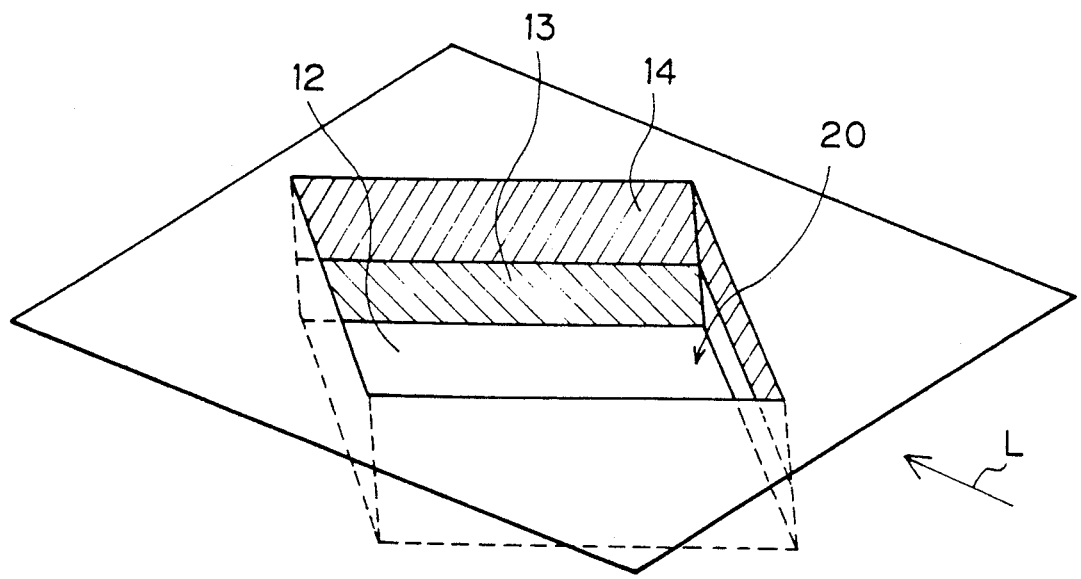
FIG. 3 is an explanatory view for explaining a recess in accordance with another embodiment of the present invention.

FIG. 3 illustrates another embodiment of the present invention.

In this embodiment, the shape of the recess 20 is different from that of FIG. 1d. The recess 20 has a rhombus shape in the plan view. The silicon oxide film 14 and the polycrystalline silicon thin film 13 are exposed in the recess 20 to define the inner side wall thereof and the silicon oxide film 12 is exposed in the recess 20 to define the bottom surface of the recess in the same manner as the structure of FIGS. 1.

The laser beam scans the layered structure along the direction of the diagonal of the rhombus recess 20. As explained before with reference to FIG. 4, the recess 20 comprises a first triangle recess 20a oriented to the forward direction L of the scanning beam and a second triangle recess 20b oriented to the backward direction of the scanning beam. The base sides of the two triangles are faced to each other and combined together to form a rhombus shape.

Figure 5:
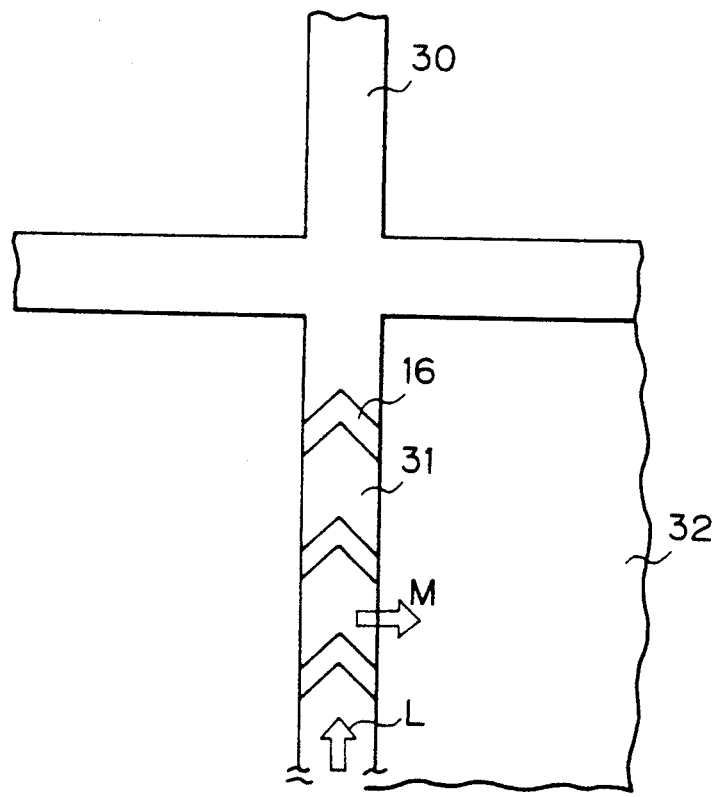
FIG. 5 is a plan view of still another example of the recess layout in accordance with the present invention.

Semiconductor integrated circuits are fabricated from a number of chips arranged regularly along the dicing line formed on a silicon wafer. In accordance with the present invention, as illustrated in FIG. 5, a plurality of recesses 16 are formed along the dicing line 30. Numeral 32 designates a chip area. The distance between the adjacent two recesses 16 is determined so that the area between the recesses are sufficiently cooled by the recesses 16. The distance is also related to the scanning speed of the laser beam. The scanning speed is determined in relation to the energy of the laser beam. Each recess 16 is formed in accordance with the process as described before with reference to FIGS. 1a to 1d.

By scanning the structure by the laser beam along the dicing line 30 in the direction L, the polycrystalline silicon thin film is changed to a single crystal film in the area between the recesses 16.

After that, the laser beam scans the structure toward the chip area as indicated by an arrow M from the area of silicon film 31 which is changed to the single crystal structure. Thereby, the polycrystalline silicon thin film on the chip 32 is changed to a uniformed single crystal thin film.

The shape of the recess formed on the dicing line 30 may be rhombus as illustrated in FIG. 3, instead of the reversed V shape.

Also, an amorphous silicon thin film may be used instead of the polycrystalline silicon thin film 13 used in the above mentioned embodiments.

In accordance with the above mentioned embodiments, the dielectric layer formed on the polycrystalline film 13 is made from a silicon oxide film 14. However, a silicon nitride film may be used instead of the silicon oxide film 14. Also, the dielectric layer may be formed as a double-layer structure comprising a silicon nitride film and a silicon oxide film. It is to be noted that the wetting property of polyethylene glycol with respect to the silicon oxide film is better than that with respect to the silicon nitride film so that an even dielectric layer can be obtained by using the silicon oxide film. The double-layer structure is preferably composed of two films which have the same or similar heat conductivity.

The rotational shift of the crystal axis at the time of recrystallization is described hereinafter.

Figure 6:
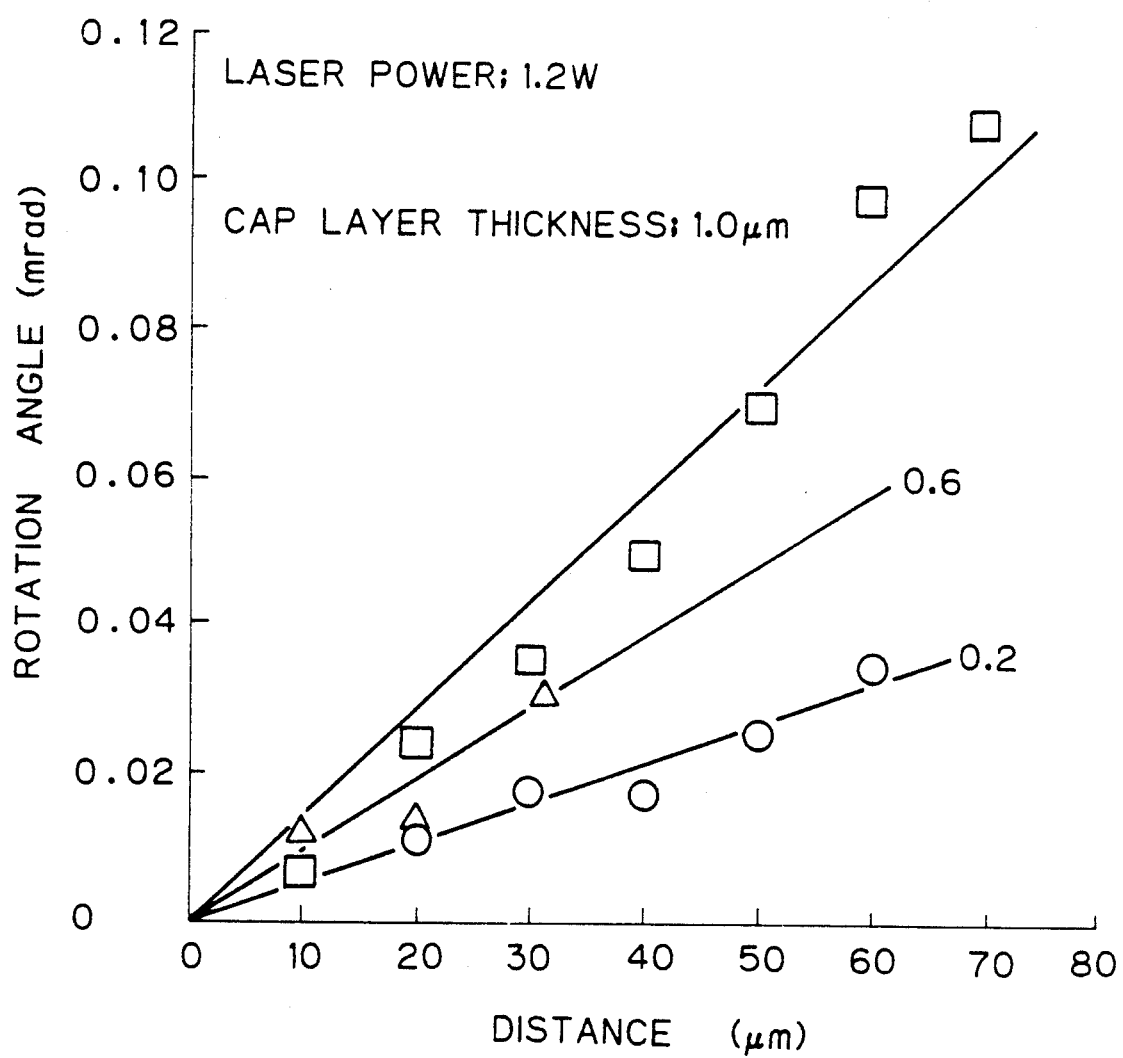
FIG. 6 is a graphical view representing the crystal axis rotation angle in relation to the thickness of the protective cap layer.

FIG. 6 represents a measurement result of the rotation angle of the crystal axis at the time of recrystallization after the amorphous silicon is melted by the laser beam. The measurement is conducted under the condition that a silicon oxide film of about 1000 Å thick is formed on a glass substrate, that an amorphous silicon thin film of about 5000 Å is formed on the silicon oxide film, that a protective cap layer made from a silicon oxide film is formed on the amorphous film and that the protective layer is coated with a polyethylene glycol layer through which the laser beam is irradiated to the layered sample to melt and recrystallize the sample.

Three samples are measured, the protective cap layers of the samples being 0.2 μm, 0.6 μm and 1.0 μm, respectively. The crystal orientation is measured by using an electronic channeling pattern.

As can be seen from FIG. 6, the rotation angle of the crystal axis is decreased according as the silicon oxide film of the protective cap layer becomes thin.

In general, it is known that the crystal axis is rotated in the scanning direction of the laser beam at the time of melting and recrystallizing the sample. It is possible to reduce the rotation angle of the crystal axis by adjusting the thickness of the substrate and the thickness of the cap layer formed on the semiconductor thin film so as to properly adjust the heat radiation effect from the upper and lower sides of the semiconductor film to control the temperature distribution of the semiconductor thin film along the direction of the thickness thereof. That is, by arranging the structure such that the heat conductivity of the upper side of the semiconductor thin film is approximately equal to that of the lower side thereof, it becomes possible to form a single crystal semiconductor thin film having a large grain size and reduce the rotation angle of the crystal axis as well.

Examples of the thin film structure in which the rotation angle of the crystal axis is reduced are as follows.

The base substrate comprises a silicon plate on which a silicon oxide film of about 6000 to 12,000 Å, preferably about 8000 Å, is formed or a glass plate on which a silicon oxide film of about 1000 Å is formed.

On the base substrate is formed a semiconductor thin film of about 3000 to 6000 Å, preferably about 5000 Å, made from a polycrystalline or amorphous silicon film.

On the semiconductor thin film is formed a protective cap layer which is made from a silicon oxide film of about 1000 to 3000 Å, preferably 2000 Å, or a silicon nitride film of about 7000 to 9000 Å, preferably 8000 Å, or a double layered film comprising a silicon nitride film and a silicon oxide film stacked on the silicon nitride film in which the silicon nitride film is about 400 to 800 Å thick, preferably about 500 Å thick and the silicon oxide film is about 1000 to 3000 Å thick, preferably about 2000 Å thick.

To even the thickness of the polyethylene glycol layer 15, an optical glass plate may be disposed on the layer 15.

As the cooling midium, it is possible to use a general surface-active agent such as polyethylene ether, polyethylene ester or polypropylene oxide, other than the polyethylene glycol used in the embodiments mentioned above.

As the energy beam, it is possible to use an optical beam or a heat wave beam having a temperature distribution other than the Gaussian distribution instead of the laser beam.

The shape of the recess is not limited to those of the embodiments mentioned before but can be varied to improve the temperature distribution of the semiconductor thin film in accordance with the present invention.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for producing a semiconductor thin film by melt and recrystallization process in such a way that at least one recess is formed in a stacked layered structure including a semiconductor thin film layer, said recess having an arrow head shape seen from a surface side of said layered structure, an apex of said arrow head shape being oriented to a forward direction on a scanning line, that said surface of said layered structure is covered with a cooling medium so that said recess is filled with said cooling medium, and that an energy beam is irradiated to said layered structure through said cooling medium to scan said structure along said scanning line so as to melt said semiconductor thin film and thereafter said semiconductor is cooled and recrystallized to form a single crystal structure therein.

2. A method for producing a semiconductor thin film according to claim 1, wherein said recess comprises a first arrow head portion and a second arrow head portion which is oriented to a direction opposite to said first arrow head, said first and second arrow head portions are combined together to form a substantially rhombus shape.

3. A method for producing a semiconductor thin film according to claim 1, wherein said stacked layered structure comprises a substrate, a dielectric layer formed on said substrate, a semiconductor layer formed on said dielectric layer, a protective layer formed on said semiconductor layer.

4. A method for producing a semiconductor thin film according to claim 3, wherein said substrate comprises a silicon plate.

5. A method for producing a semiconductor thin film according to claim 3, wherein said substrate comprises a glass plate.

6. A method for producing a semiconductor thin film according to claim 3, wherein said dielectric layer comprises a silicon oxide film.

7. A method for producing a semiconductor thin film according to claim 3, wherein said semiconductor layer comprises a polycrystalline silicon film which is to be changed to a single crystal silicon film by being molten and recrystallized.

8. A method for producing a semiconductor thin film according to claim 3, wherein said semiconductor layer comprises an amorphous silicon film which is to be changed to a single crystal silicon film by being molten and recrystallized.

9. A method for producing a semiconductor thin film according to claim 3, wherein said protective layer comprises a silicon oxide film.

10. A method for producing a semiconductor thin film according to claim 3, wherein said protective layer comprises a silicon nitride film.

11. A method for producing a semiconductor thin film according to claim 3, wherein said protective layer comprises a double-layer film composed of a silicon oxide film and a silicon nitride film.

12. A method for producing a semiconductor thin film according to claim 1, wherein said cooling medium comprises a surface-active agent.

13. A method for producing a semiconductor thin film by melt and recrystallization process in such a way that at least one recess is formed on a scanning line in a stacked layered structure including a semiconductor thin film layer, the recess having a shape such that when seen from a surface side of said layered structure, the length thereof along said scanning line is the longest at a center thereof and gradually shortened toward a lateral side thereof, that said surface of said layered structure is covered with a cooling medium so that said recess is filled with said cooling medium, that an energy beam is irradiated to said layered structure through said cooling medium to scan said structure along said scanning line so as to melt said semiconductor thin film and after that said semiconductor is cooled and recrystallized to form a single crystal structure therein.

* * * * *